US006809799B2

(12) United States Patent
Hasegawa et al.

(10) Patent No.: US 6,809,799 B2
(45) Date of Patent: Oct. 26, 2004

(54) PROCESSING SYSTEM AND DEVICE MANUFACTURING METHOD USING THE SAME

(75) Inventors: Takayuki Hasegawa, Yokohama (JP); Yutaka Tanaka, Yokohama (JP); Hidehiko Fujioka, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/046,317

(22) Filed: Jan. 16, 2002

(65) Prior Publication Data

US 2002/0061245 A1 May 23, 2002

Related U.S. Application Data

(62) Division of application No. 09/042,691, filed on Mar. 17, 1998, which is a division of application No. 08/898,568, filed on Jul. 25, 1997, now Pat. No. 5,746,562, which is a continuation of application No. 08/278,263, filed on Jul. 21, 1994, now abandoned.

(30) Foreign Application Priority Data

| Jul. 21, 1993 | (JP) | ............................................. 5-180353 |
| Jul. 21, 1993 | (JP) | ............................................. 5-180356 |
| May 16, 1994 | (JP) | ............................................. 6-101006 |

(51) Int. Cl.[7] ............................................. G03B 27/42
(52) U.S. Cl. ........................ 355/53; 248/638; 248/639; 355/73
(58) Field of Search ............................... 414/217, 939; 901/8; 248/638, 639; 118/719; 29/25.01; 450/966, 967; 204/288.25; 355/53, 73

(56) References Cited

U.S. PATENT DOCUMENTS

| 4,363,217 A | * 12/1982 | Venuti ........................ 248/638 |
| 4,394,819 A |   7/1983  | Averill ........................ 248/638 |
| 4,827,736 A | *  5/1989 | Miura et al. ................. 62/51.1 |
| 4,959,964 A | * 10/1990 | Saho et al. ................... 62/51.1 |
| 5,042,784 A |   8/1991  | Murai et al. ................. 267/136 |
| 5,105,557 A | *  4/1992 | Vadasz et al. ................. 34/14 |
| 5,128,975 A |   7/1992  | Iwamoto et al. .............. 378/34 |
| 5,154,730 A |  10/1992  | Hodos et al. ............... 29/25.01 |
| 5,168,512 A |  12/1992  | Iwamoto et al. .............. 378/34 |
| 5,187,519 A | *  2/1993 | Takabayashi et al. ......... 355/53 |
| 5,195,113 A |   3/1993  | Kuwabara .................... 378/34 |
| 5,448,612 A | *  9/1995 | Kasumi et al. ................ 378/84 |
| 5,467,720 A | * 11/1995 | Korenaga et al. ............. 108/20 |
| 5,579,084 A | * 11/1996 | Takahashi et al. ............ 355/53 |
| 5,643,366 A | *  7/1997 | Somekh et al. ............. 118/721 |
| 5,687,947 A | * 11/1997 | Iwamoto et al. ............ 248/612 |
| 5,895,549 A | *  4/1999 | Goto et al. ................. 156/345 |
| 6,406,245 B2| *  6/2002 | Hasegawa et al. .......... 414/217 |

FOREIGN PATENT DOCUMENTS

DE  3921824  4/1990

* cited by examiner

Primary Examiner—Thomas J. Brahan
(74) Attorney, Agent, or Firm—Fitzpatrick, Cella, Harper & Scinto

(57) ABSTRACT

A processing system is disclosed which includes first and second chambers, each for accommodating a processing apparatus therein, each chamber being able to be kept gas tight, a coupling member for coupling the processing apparatuses accommodated in the first and second chambers with each other, and an elastic gas tightness holding member for gas tightly sealing portions between the coupling member and the first and second chambers.

8 Claims, 10 Drawing Sheets

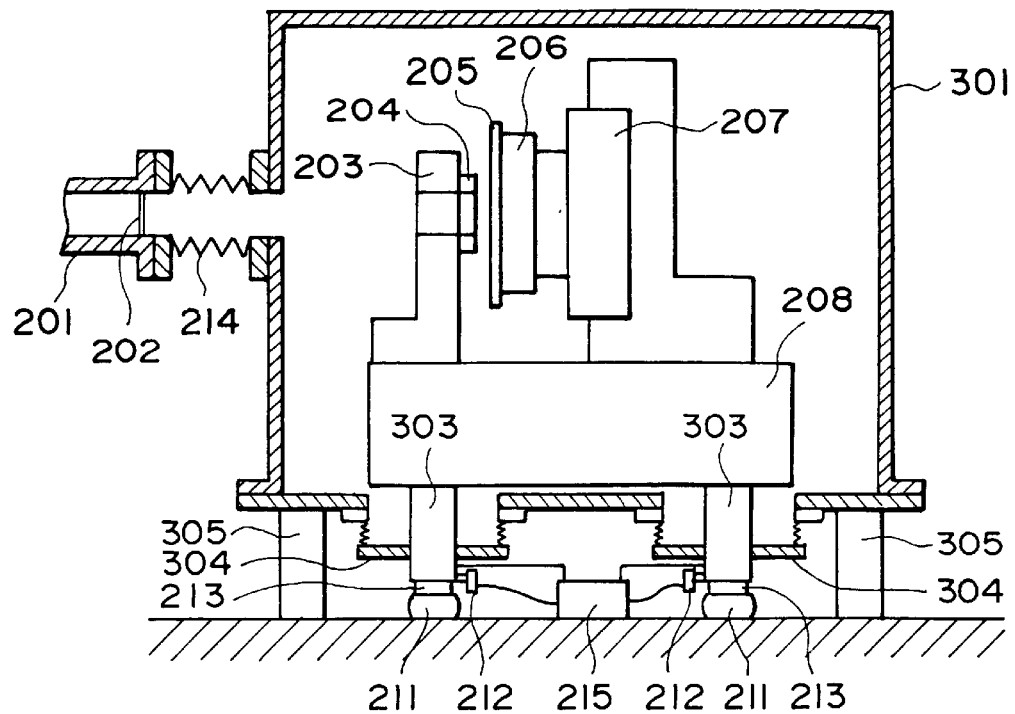
F I G. 7
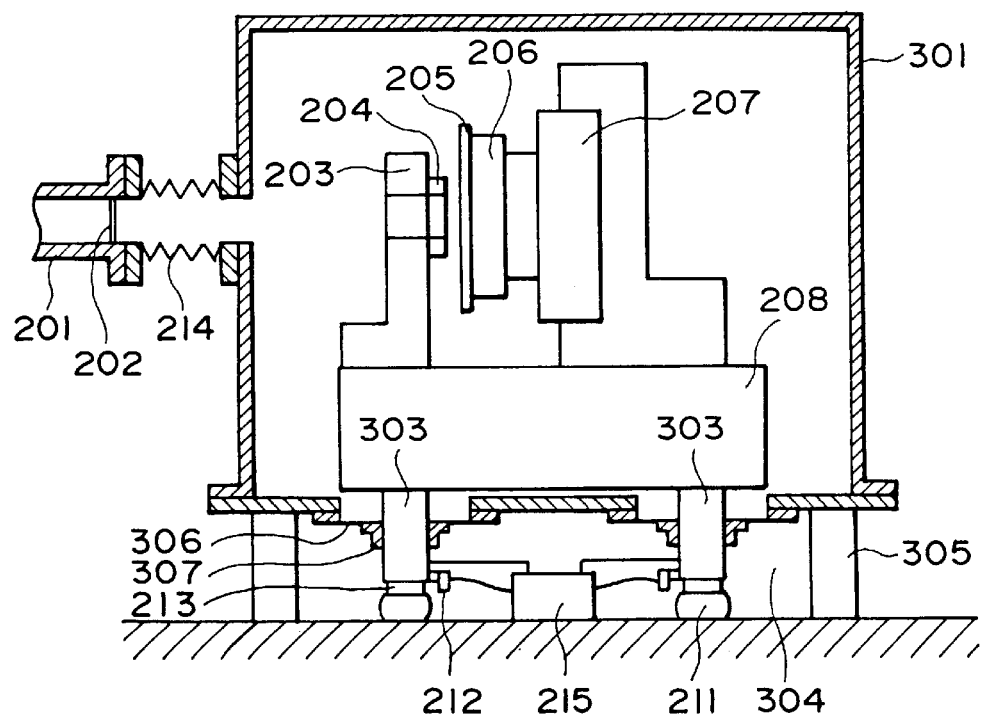
F I G. 8

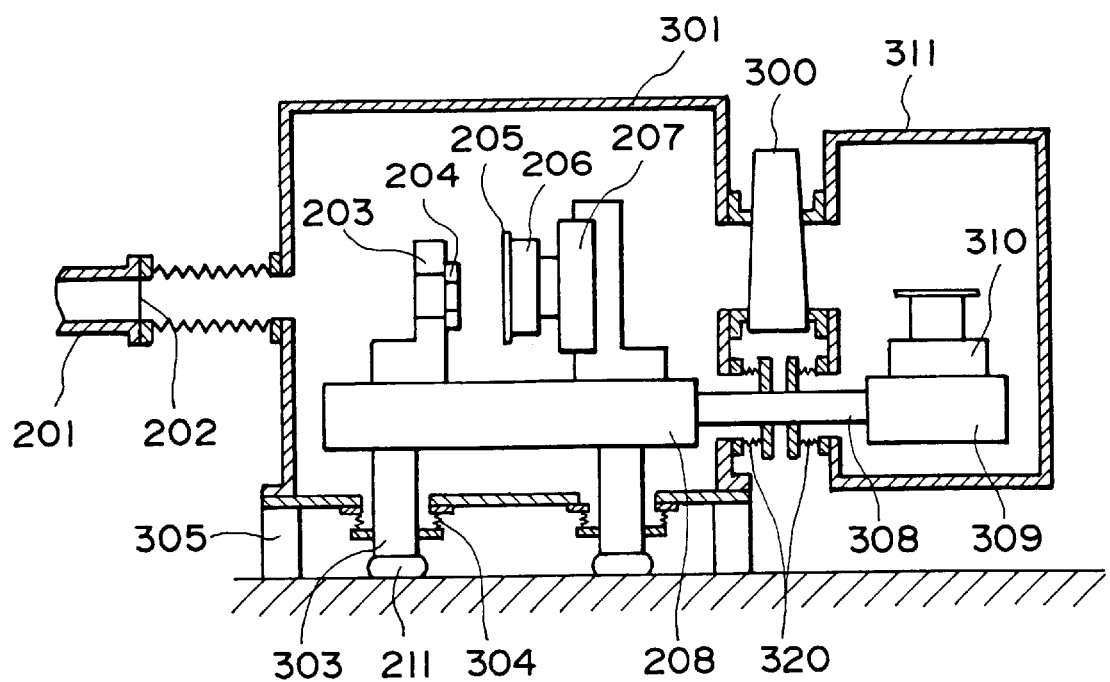
F I G. 9

PROCESSING SYSTEM AND DEVICE MANUFACTURING METHOD USING THE SAME

CROSS-REFERENCE TO RELATED APPLICATIONS

This is application is a division of U.S. patent application Ser. No. 09/042,691, filed Mar. 17, 1998, which in turn is division of U.S. patent application Ser. No. 08/898,568, filed Jul. 25, 1997, now U.S. Pat. No. 5,746,562 which, in turn, is a continuation of application Ser. No. 08/278,263, filed Jul. 21, 1994 now abandoned.

FIELD OF THE INVENTION AND RELATED ART

This invention relates to a processing system, such as an exposure system or a thin film forming system, for example, for performing a certain process in a reduced pressure ambience.

X-ray exposure apparatuses using SR (synchrotron radiation) light are known. The SR light is attenuated largely in air and, to avoid this, a synchrotron ring and a beam port for emitting SR light are kept under vacuum. The SR light is directed through a blocking window (beryllium window) into an exposure apparatus in which a mask and a wafer are placed. Also, the mask and the wafer are desirably disposed in an exposure ambience of vacuum or reduced pressure helium and, thus, the exposure apparatus is desirably accommodated in a reduced pressure container.

FIG. 12 is a schematic view of a known type processing system. Denoted in the drawing at 1 is a process chamber of reduced pressure ambience in which a process such as an exposure process or a thin film forming process, for example, is performed. Denoted at 2 is a load-lock chamber. While not shown in the drawing, there are a pump and valves for gas supplying and discharging of these two chambers. Disposed between the two chambers are a gate valve 9 and a bellows 11. Closing the gate valve 9 is effective to maintain the pressures of the two chambers, respectively.

The process chamber 1 is supported through supporting members 8a and 8b by a first base table 3, while the load lock chamber 2 is supported thereby through supporting members 8c and 8d. The first base table 3 is provided with air mounts (air springs) 16 by which vibration from the floor can be intercepted. Within the process chamber 1, a second base table 4 is supported by supporting members 8e and 8f. Processing stage 12 and a conveying robot 13 are mounted on the second base table 4. Within the load lock chamber 2, a third base table 5 is supported by supporting members 8g and 8h. Sample holding table 14 for holding a sample such as a substrate, for example, is mounted on the third base table 5.

FIG. 13 is a schematic view of another processing system of known type. SR light is projected through a beam port having its inside maintained under ultra high vacuum and through a beryllium window 52, into a stage accommodating chamber 60 of reduced pressure helium ambience. Disposed within the stage accommodating chamber 60 is a base table 58 which supports a mask chuck 53 for holding a mask 54 through attraction as well as a stage 57 for positioning a wafer 55, held by a wafer chuck 56 through attraction, with respect to the mask 54. The base table 58 is supported by air mounts (air springs) 61 by which adverse effect of vibration of the beam port or of vibration of the floor can be reduced.

SUMMARY OF THE INVENTION

In the structure of FIG. 12, when the process chamber 1 and the load lock chamber 2 are evacuated to reduce the inside pressure, elastic deformation of each chamber may be cause by the pressure reduction. Such deformation may be transmitted to the components placed inside the chamber to damage the positional relationship of the components. It may adversely affect sample transfer precision.

It is accordingly a first object of the present invention to provide an improved system which is free from the problem described above. More specifically, it is an object of the present invention to provide a processing system or a device manufacturing method using such a system, wherein adverse effect of deformation of any one of plural chambers to the positional relationship of components accommodated in the chambers can be avoided.

On the other hand, the structure shown in FIG. 13 involves problems in relation to the provision of the air mounts 61 inside the reduced pressure ambience in the chamber 60. One problem is the possibility of that the reduced pressure ambience is damaged by air leakage from the air mount, for example. Also, the height of the air mount changes with a change in relative difference between the pressure inside the chamber 60 and the pressure of the air mount, and this causes a change in position of a component mounted. Further, since an exposure apparatus is supported within the chamber 60, deformation caused by the pressure reduction may be transmitted to the inside exposure apparatus through the air mount, resulting in a change in position or attitude of the processing apparatus.

It is accordingly a second object of the present invention to provide an improved system which is free from the problem described above. More specifically, it is an object of the present invention to provide a processing system or a device manufacturing method using the same, by which degradation of ambience within the chamber is prevented and by which any change in position or attitude of a processing apparatus accommodated in the chamber is prevented.

It is a third object of the present invention to provide a processing system having a plurality of chambers, by which a process such as a high precision exposure process or thin film forming process can be performed.

In accordance with an aspect of the present invention and to achieve the first or third object of the present invention, there is provided a processing system which comprises first and second chambers each accommodating a processing apparatus therein, the inside of each chamber being able to be kept gas tight, a coupling member for coupling the processing apparatuses accommodated in the chambers and elastic gas tight holding means for gas tightly sealing the portions between the coupling member and the first and second chambers.

In accordance with another aspect of the present invention and to achieve the second or third object of the present invention, there is provided a processing system which comprises a chamber for accommodating a processing apparatus therein, the inside of the chamber being able to be kept gas tight, a base for supporting the processing apparatus, air mount means for supporting the base and supporting means for supporting the chamber, wherein the air mount means are disposed outside the chamber. The base and the chamber are preferably connected to each other gas tightly.

A processing system according to a further aspect of the present invention comprises a first chamber, a second chamber connected to the first chamber, a third chamber connected to the second chamber, a coupling member for mutually coupling apparatuses accommodated in the first and second chambers, and a bellows for coupling the second and third chambers with each other.

In the present invention, an exposure process may preferably be performed to a sample accommodated in the first chamber. By using a processing system of the present invention, high precision devices may be manufactured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a schematic view of a processing system according to a fifth embodiment of the present invention.

FIG. 8 is a schematic view of a modified form of the FIG. 7 embodiment.

FIG. 9 is a schematic view of a processing system according to a further embodiment of the present invention.

DESCRIPTION OF THE PREFERRED EMBODIMENTS

[Embodiment 1]

Figure 1:
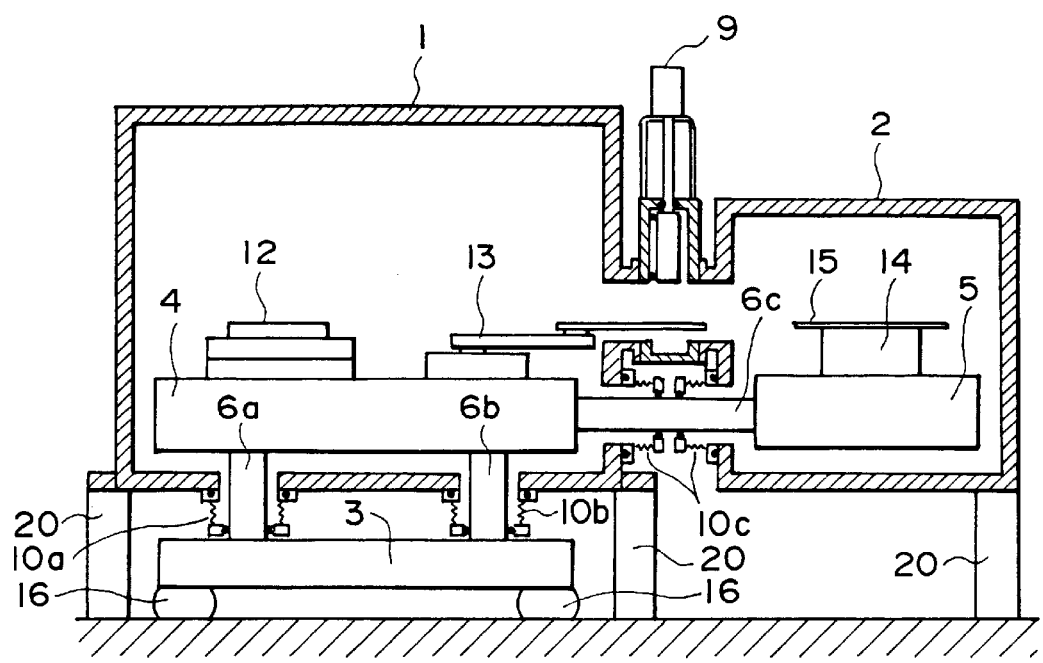
FIG. 1 is a schematic view of a processing system according to a first embodiment of the present invention.
Figure 12:
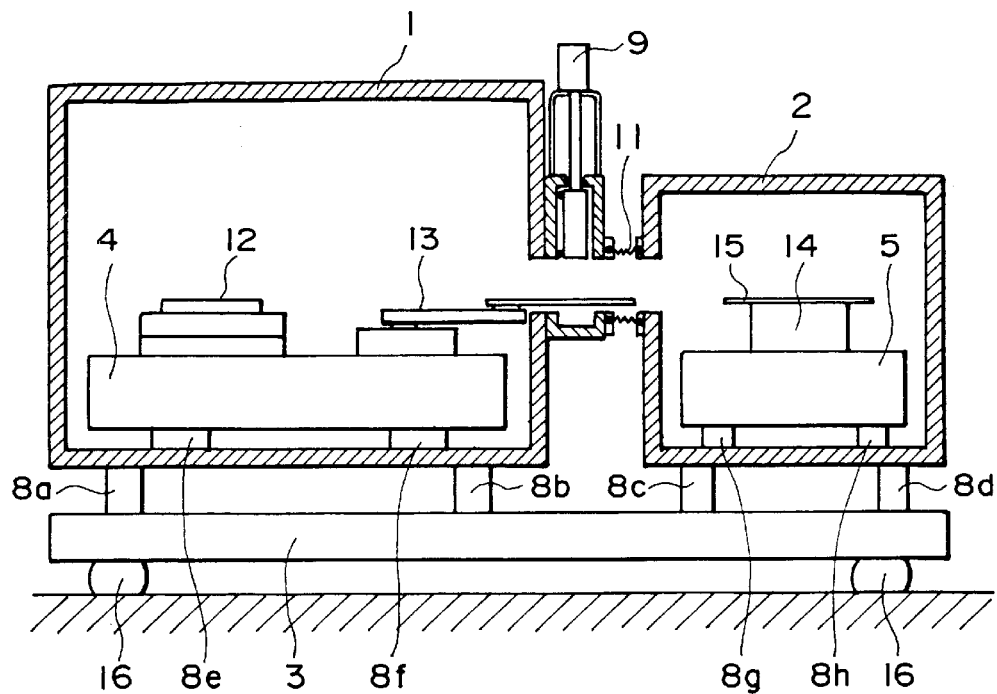
FIG. 12 is a schematic view of a known type processing system.
Figure 13:
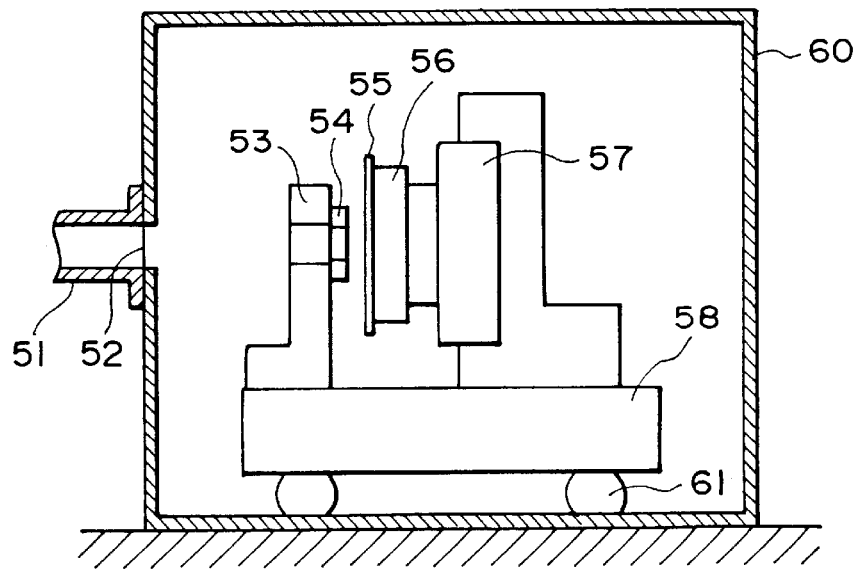
FIG. 13 is a schematic view of another processing system of known type.

FIG. 1 is a schematic view of a processing system according to a first embodiment of the present invention. In FIG. 1, like numerals as of those of FIG. 12 or 13 are assigned to similar or corresponding elements.

Process chamber 1 and load lock chamber 2 are secured to the floor by means of pillars 20. First base table 3 and second base table 4 are coupled to each other by means of supporting members 6a and 6b, while the second base table 4 and third base table 5 are coupled to each other by means of supporting member 6c. The coupling of these components is accomplished with high rigidity, such that the first, second and third base tables can be regarded as a substantially integral structure. Here, the supporting members 6a and 6b and the process chamber 1 are gas tightly connected with each other by means of elastic bellows 10a and 10b. Also, the supporting member 6c, the process chamber 1 and the load lock chamber 2 are gas tightly connected with each other by means of elastic bellows 10c. Thus, the gas tightness of inside of each chamber 1 or 2 can be maintained. The elastic gas tightness holding means for gas tightly connecting the supporting member and the chamber may be any other than bellows. An example is a mechanism having multiple 0-rings or leaf springs.

The sequence of sample transfer in the described structure from the load lock chamber 2 to the process chamber 1, will now be explained. First, while the gate valve 9 is held closed, the inside of the process chamber 1 is evacuated to a vacuum. On the other hand, a sample is introduced from the outside to the inside of the load lock chamber 2 (atmospheric), and the sample 15 is placed on a sample holder 14. After this, vacuum is introduced into the chamber 2, and a vacuum of substantially the same level as the inside pressure of the process chamber is defined therein. Subsequently, the gate valve is opened, and the sample 15 is unloaded from the load lock chamber 2 by means of a conveying robot 13. The sample is conveyed onto a processing stage 12 within the process chamber 1. Then, the gate valve 9 is closed again, if necessary, and a process such as an exposure process or a thin film forming process, for example is performed to the example within the process chamber 1. After the process is completed, the processed sample 15 is conveyed back into the load lock chamber along the path same as the path of sample introduction. When the processing of samples of a predetermined number is completed, the gate valve is closed and atmosphere is introduced again into the load lock chamber 2. Then, the samples are unloaded from the chamber 2 to the outside.

Deformation may be created in the process chamber 1 as a result of pressure reduction. However, the second base table 4 is connected to the first base table 3, and it is not directly connected to the chamber 1. Therefore, chamber deformation can be absorbed by the elasticity of the bellows 10a and 10b. Consequently, the position of the second base table 4 is not affected by the state of pressure inside the process chamber, such that the positional relationship having been set under atmospheric pressure is maintained. Similarly, deformation of the load lock chamber due to pressure reduction is not directly transmitted to the third base table 5, this being attributable to the function of the bellows 10c.

As a result, independently of the state of the inside pressure of the process chamber 1 and the load lock chamber 2, the structures accommodated in these chamber are not adversely affected thereby. This assures that the conveyance robot 13 performs high precision transfer of samples 15 between the processing stage 12 and the sample table 14, disposed on these structures, respectively.

[Embodiment 2]

Figure 2:
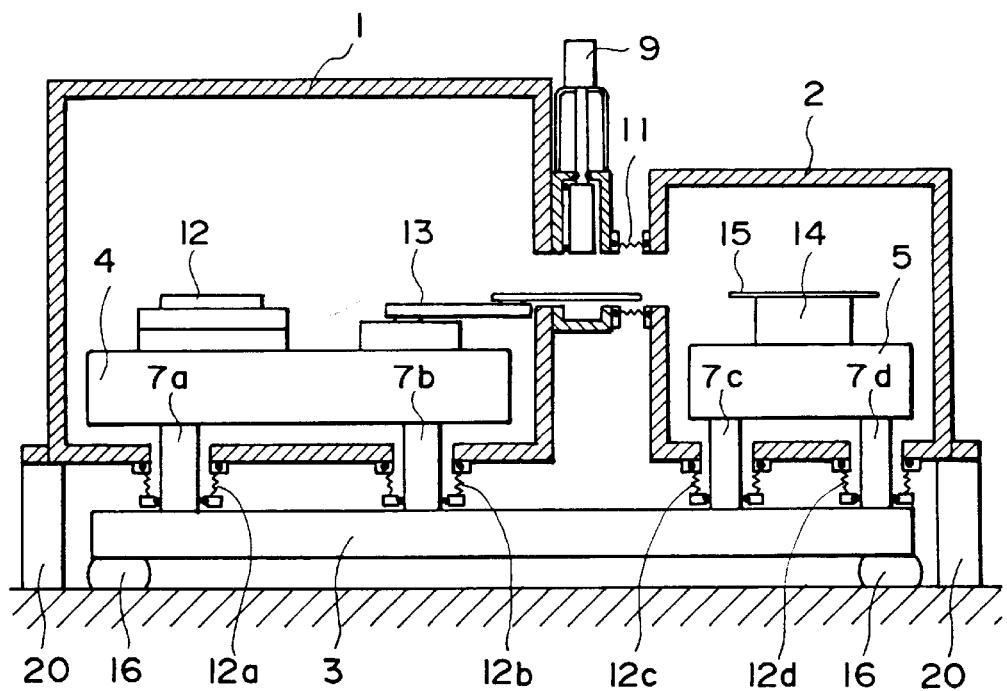
FIG. 2 is a schematic view of a processing system according to a second embodiment of the present invention.

FIG. 2 is a schematic view of a processing system according to a second embodiment of the present invention. Like numerals as of the first embodiments are assigned to corresponding elements. Process chamber 1 and load lock chamber 2 are coupled to each other through a gate valve 9 and bellows 11. These chambers are fixed to the floor by means of pillars 20. On the other hand, first base table 3 and second base table 4 are connected with each other by supporting members 7a and 7b. Also, the third base table 5 is connected to the first base table 3 by supporting members 7c and 7d. Similarly to the preceding embodiment, these components are coupled with high rigidity, such that the first, the second and the third base table can be regarded as a substantially integral structure. Here, the supporting members 7a and 7b and the process chamber 1 are gas tightly connected with each other by means of elastic bellows 12 and 12b, while the supporting members 7c and 7d and the load lock chamber 2 are gas tightly connected with each other by means of elastic bellows 12c and 12d. The gas tightness of the inside of each chamber 1 or 2 can be maintained in this manner.

In the structure described above, like the first embodiment, any deformation of the process chamber 1 and the load lock chamber 2 due to pressure reduction is absorbed by the bellows 12a–12d. Thus, deformation of chamber does not adversely affect the structure accommodated in the chamber, and high precision transfer of samples 15 between these two chambers is assured as in the preceding embodiment. Since in this embodiment both of the second base table 4 and the third base table 5 are mounted on the first base table 3, the assembling and adjusting operation may be performed by using the first base table as a reference surface. This facilitates easy operation.

[Embodiment 3]

In future semiconductor device manufacturing process, operations to be handled by operators will be reduced. With transition from batch processing to discrete processing, transfer of each sample using a conveying robot or the like will be an important matter in the manufacture line. Also, in the semiconductor manufacturing technology for a device of 64 MDRAM or a device of higher integration, chemical amplification type resist requires, due to its property, exact time control at each step of resist application, exposure, development and rinsing, for each wafer. Thus, a manufacturing line of discrete processing may be required. This embodiment is particularly suitable to a manufacturing line to be operated both in a case where sample transfer is to be done in a reduced pressure ambience and in a case where sample transfer is to be done in an atmospheric pressure, both with high conveyance precision.

Figure 3:
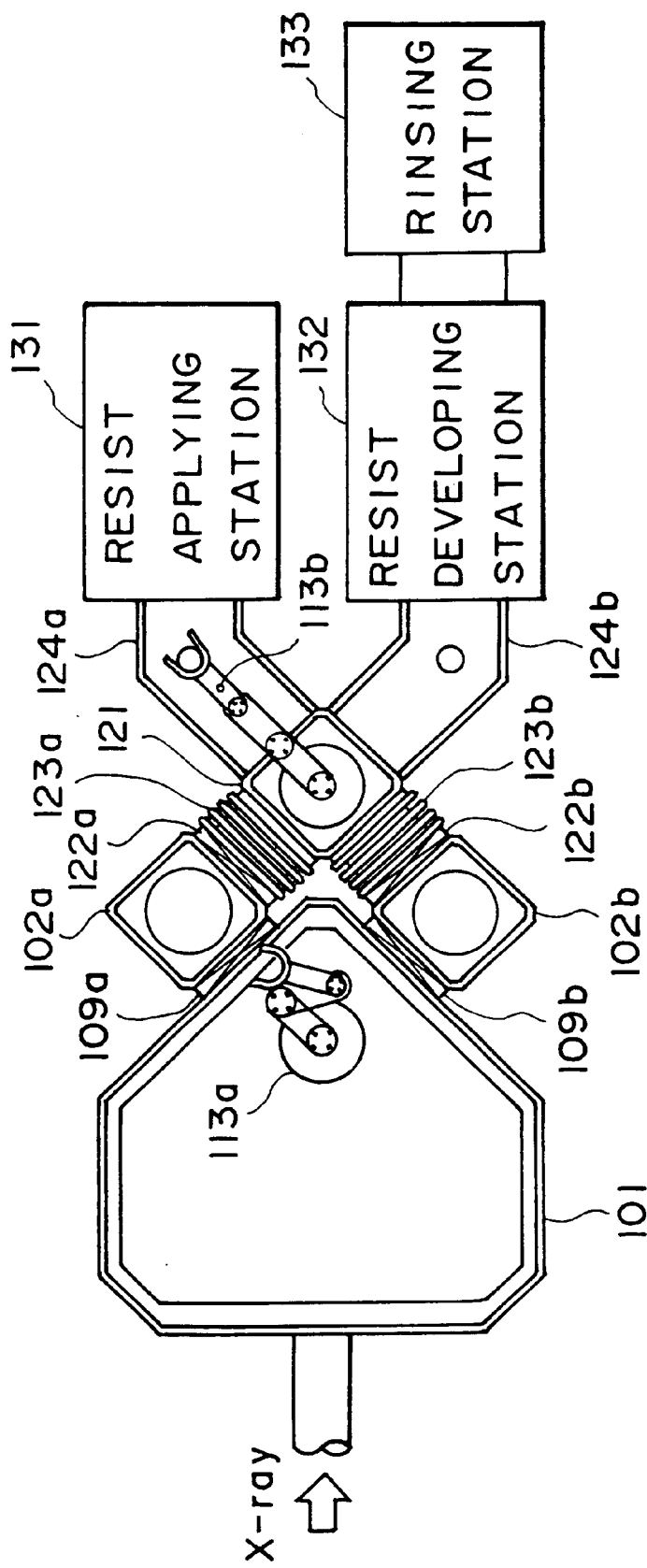
FIG. 3 is a schematic view of a processing system according to a third embodiment of the present invention.
Figure 4:
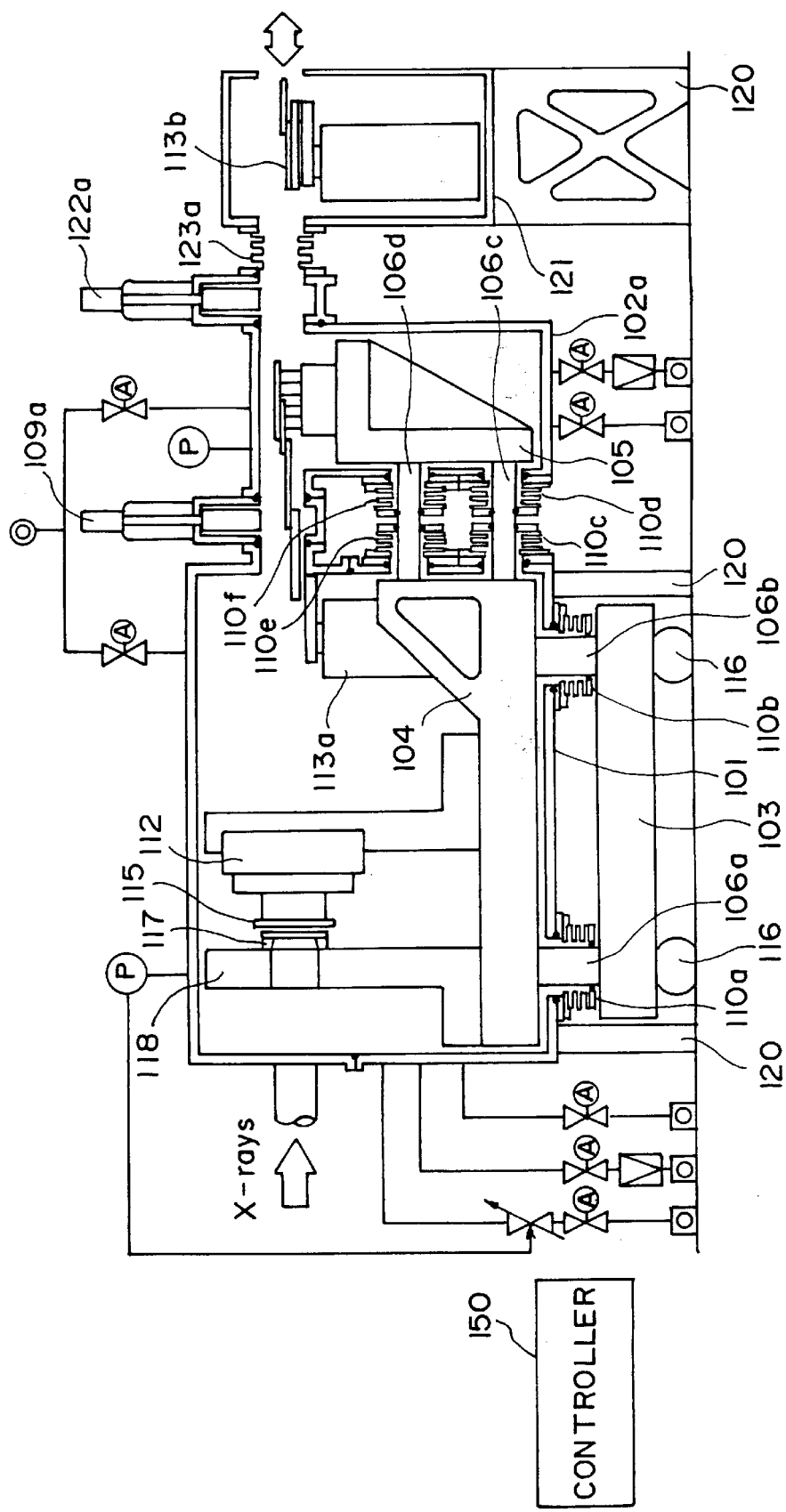
FIG. 4 is a sectional view of the processing system of the third embodiment.

FIG. 3 is a schematic view of the manufacturing line including a processing system of this embodiment. FIG. 4 is a sectional view for illustrating the connection of chambers. Denoted in FIG. 3 at 101 is a process chamber; at 102a is a load chamber; at 102b is an unload chamber; and at 121 is a conveyance module chamber. Gate valve 109a is disposed between the load chamber 102a and the process chamber 101, while gate valve 122a and bellows 123a are disposed between the conveyance modulo chamber 121 and the load chamber 102a. Also, gate valve 109b is provided between the unload chamber 102b and the process chamber 101, while gate valve 122b and bellows 123b are provided between the conveyance module chamber 121 and the unload chamber 102b. Denoted at 113a and 113b are conveyance robots, each for conveying a sample between corresponding chambers. Denoted at 124a and 124b are clean tunnels each defining a path of sample conveyance. Denoted at 131 is a resist applying station, and denoted at 132 is a developing station. Denoted at 133 is a rinsing station.

FIG. 4 illustrates the coupling relationship of the process chamber 101, the load chamber 102a and the conveyance module chamber 121. The process chamber 101 and the load chamber 102a are coupled with each other in a similar manner as described with reference to the preceding embodiment, by means of bellows 110c–110f and connecting members 106c and 106d for connecting the inside structures accommodated in these chambers with each other. The conveyance module chamber 121 is supported by supporting pillars 120 separate from the supporting means for the process chamber 101 and the load chamber 102a. Also, by means of a gas supplying and discharging system which comprises a pump and a regulator, for example, a reduced pressure state and an atmospheric pressure state can be selectively produced in each of the process chamber 101 and the load chamber 102a, independently of each other. There is a controller 150 having a computer, for controlling the operations of the gas supplying and discharging system, the conveyance robots and the gate valves as a whole, by which the operation of the system as a whole can be controlled.

Figure 5:
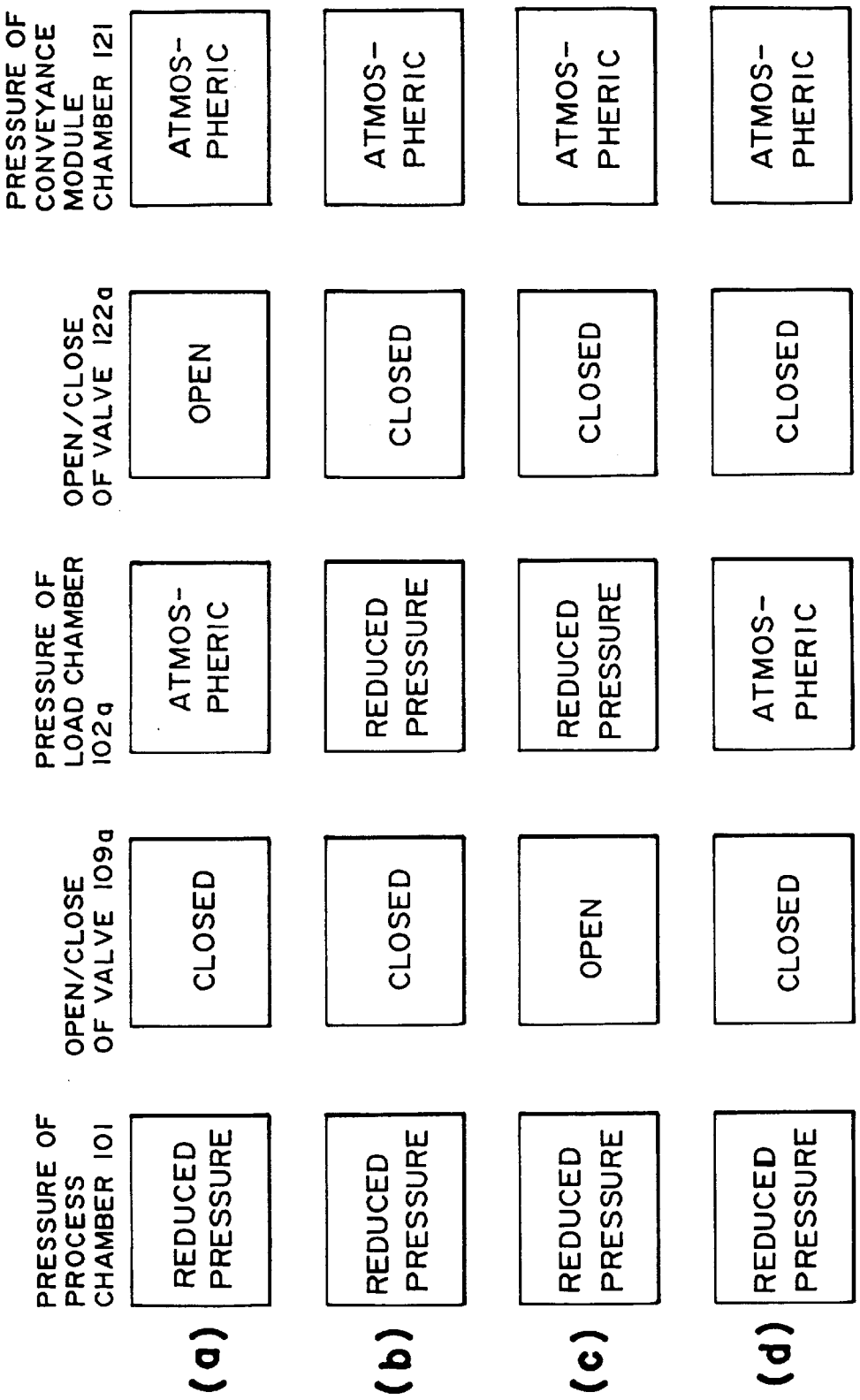
FIG. 5 is a schematic view for explaining the state of chambers and gate valves in respective steps.

Now, the operation will be explained along the flow of a sample in the manufacturing processes. The processes to be performed to a sample prior to an exposure process are as follows. The state (open/closed) of each gate valve and the stage of pressure in each chamber, in each manufacturing step, are illustrated in FIG. 5.

(1) At the resist applying station, a chemical amplification type resist is applied to a sample.

(2) By means of the conveyance robot 113b, the sample is conveyed from the resist applying station to the conveyance module chamber 121 through the clean tunnel 124a.

(3) The gate valve 122a is opened, and the sample is introduced from the conveyance module chamber 121 into the load chamber 102a by the conveying robot 113b. AT this time, the load lock chamber 102a is maintained at atmospheric pressure, while the process chamber 101 is maintained at reduced pressure. As the pressure of the process chamber reduces, the chamber deforms. However, such deformation can be absorbed by the bellows 123a. Even if the deformation is not absorbed, since the sample transfer is to be done within the atmospheric pressure, the amount of deformation can be detected easily by a sensor and can be easily compensated by the conveying robot. Thus, as compared with A case where the sample transfer is to be done within a reduced pressure ambience, high precision conveyance can be attained with a simple and inexpensive structure. (FIG. 5(a))

(4) The gate valve 122a is closed, and the inside pressure of the load lock chamber 102a is reduced to the same level as of the process chamber 1. At this time, no adverse effect is applied to the process chamber 1. (FIG. 5(b))

(5) The gate valve 109a is opened, and the sample is introduced into the process chamber 101 from the load chamber 102a by the conveying robot 113a. The transfer of the sample between these two chambers is such as having been described with reference to the preceding embodiment. (FIG. 5(c))

(6) The gate valve 109a is closed, and the exposure process to the sample is performed within the pressure reduced process chamber 101. (FIG. 5(d))

(7) After the sample introduction into the process chamber 101, the load chamber 102a is purged and an atmospheric pressure is introduced thereinto again. Then, during execution of the exposure process, a next sample is introduced and placed in the load chamber 102.

The sequence of conveyance of a sample having been subjected to the exposure process, is as follows.

(8) The gate valve 109b is opened, and the sample the exposure process of which has been completed is conveyed by the conveying robot 113a from the process chamber 101 to the unload chamber. The unload chamber 102b is held at a reduced pressure.

(9) The gate valve 109b is closed, and the gate valve 122b is opened by which the unload chamber 102 is opened to atmosphere.

(10) The sample is conveyed by the conveying robot 113b from the unload chamber 102b to the conveyance module chamber 121. Then, it is conveyed by the conveying robot 113b to the resist developing station 132 through the clean tunnel 124b.

(11) At the resist developing station 132, a developing process is performed to the sample. The thus developed sample is then moved to the rinsing station whereat a rinsing process for the same is performed.

In accordance with this embodiment of the present invention, as described above, an exposure process for a sample and a conveying operation for another sample can be performed in parallel with each other, and yet, vibration caused by the conveying operation, for example, does not adversely affect the exposure process.

[Embodiment 4]

Figure 6:
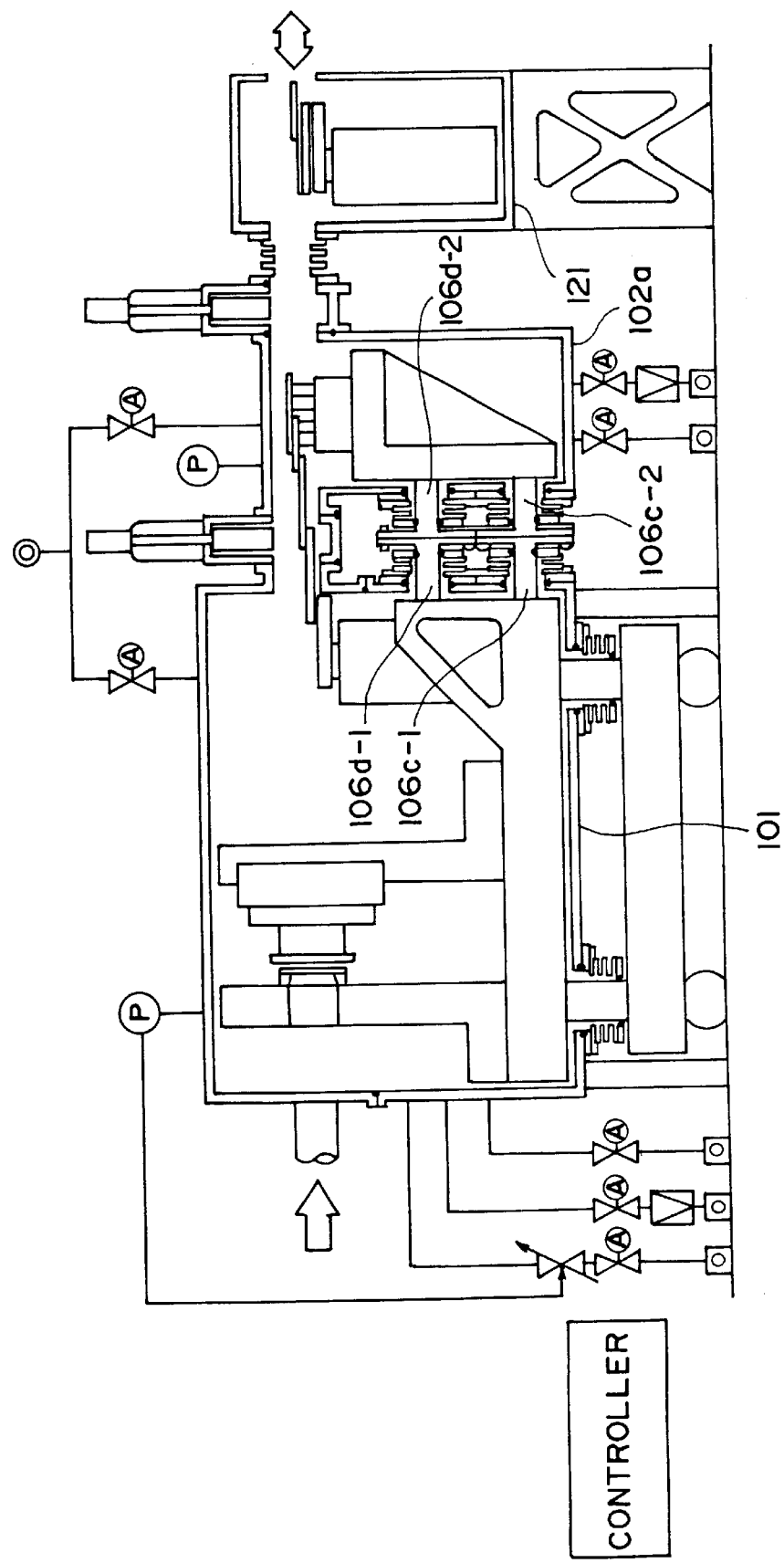
FIG. 6 is a schematic view of a processing system according to a fourth embodiment of the present invention.

FIG. 6 is a schematic view of an embodiment which corresponds to a modified form of the FIG. 4 embodiment, in respect to the coupling members 106c and 106d. In the illustrated structure, the coupling member 106c is bisected into a coupling member 106c-1 and a coupling member 106c-2 which are connected with each other within atmospheric pressure outside the chamber. This is also with the case of coupling members 106d-1 and 106d-2.

With this structure, in a manufacturing line of discrete processing, easy unit replacement is attained to facilitate the assembling operation and maintenance (FRU: Field Replaceable Unit). Namely, when the load chamber 102a is to be changed, the operation can be completed with minimum number of assembling steps.

[Embodiment 5]

Referring now to FIG. 7, an X-ray exposure system according to a fifth embodiment of the present invention will be explained. In FIG. 7, SR light produced by an SR light source (not shown) is directed through a beam port 201 and, after passing a beryllium window 202, it is introduced into a chamber 301. The chamber 301 and the beam port 201 are connected with each other gas tightly by means of elastic bellows 214. Here, a reduced pressure helium ambience of about 150 Torr is maintained inside the chamber 310.

Exposure apparatus disposed within the chamber 301 will be explained. Mask 204 is held by attraction by a mask chuck 203, and a wafer 205 is held by attraction by a wafer chuck 206. The water 205 can be displaced by a positioning stage 207, relatively to the mask 204. The mask chuck 203 and the positioning stage 207 are supported by a base table 208. Table pillars 303 which are portions of the base table 208 are supported by air mounts (air springs) 211 placed on the floor. The table pillars 303 are connected to the chamber 301 gas tightly by means of bellows 304. Each table pillar has a hydraulic cylinder 213 accommodated therewithin, for changing the length of the pillar. These hydraulic cylinders 213 are controlled by a control device 215 so that measured values of distance measuring sensors 212, mounted to the pillars to measure the distance to the floor, become even. The chamber 301 is supported on the floor by chamber pillars 305. Thus, the chamber 301 and the base table 208 are separately supported by the floor.

Here, the rigidity of the bellows 304 with respect to the vertical direction is sufficiently small as compared with the wall of the chamber 301 and with the air mounts. Thus, any deformation of the chamber 301 attributable to pressure reduction can be absorbed by the bellows, and adverse effect to the base table on which an exposure apparatus is mounted can be avoided. Even if the chamber vibrates due to vibration of the floor, vibration can be absorbed by the bellows 304. Therefore, it does not adversely affect the performance of the air mounts 211. If a higher precision is required, the pillars 305 may be placed on air mounts, separate from the air mounts 211 for supporting the base table 208. In that occasion, the position of the chamber 301 is changeable with the differential pressure of the opening of the beam port. However, this is not a problem since such change is absorbed by the bellows 304 between the chamber and the base table.

Further, since the air mounts 211 are disposed outside the reduced pressure helium ambience of the chamber 301, any air leakage from the air mount does not result in degradation of the inside ambience of the chamber 301. Additionally, independently of the pressure reduction, the height of the air mounts 211, namely, the position of the exposure apparatus on the base table can be held constant.

Since the hydraulic cylinders 213 are controlled so that measured values of the sensors 212 become even, the attitude of the exposure apparatus on the base table 208 is maintained precisely irrespective of any change in atmospheric pressure.

The elastic gas tightness holding means for gas tightly coupling the table pillars 303 with the chamber 310, may be any other than bellows. An example is a mechanism having multiple O-rings or leaf springs. Such example is illustrated in FIG. 8. In FIG. 8, like numerals as of those of FIG. 7 are assigned to corresponding elements. In this embodiment, base table pillars 303 and the chamber 301 are gas tightly coupled with each other by elastic gas tightness holding means comprising leaf springs 306 and magnetic fluid seals 301. In this case, the rigidity is lower than that of the bellows, and any deformation or a change in attitude of the chamber can be absorbed more effectively.

[Embodiment 6]

FIG. 9 is a schematic view of a further embodiment of the present invention. Like numerals as of those of FIG. 7 are assigned to corresponding elements. Denoted at 311 is a second chamber which is connected to the chamber 301. Openable and closable gate valve 300 is provided between the chamber 301 and the second chamber 311. Within the second chamber 311, a wafer changing mechanism 310 is mounted on the second base table 309. Also, the second base table 309 and the base table 208 are rigidly connected with each other by means of a table pillar 308 having a high rigidity. Elastic bellows 320 serve to couple the pillars 308 and the chambers 301 and 311, gas tightly.

The structure described above assures an advantageous result, in addition to the advantage having been explained with reference to the FIG. 7 embodiment: that is, since any deformation of the chambers 301 and 311 or a change in relative position of them is absorbed by the bellows, there occurs no positional deviation between the exposure apparatus mounted on the base table 208 and the apparatus mounted on the second base table 309. Thus, the precision of transfer between them is not damaged.

[Embodiment 7]

Next, an embodiment of device manufacturing method using an exposure apparatus or a processing system according to any one of the embodiments described above, will be explained.

Figure 10:
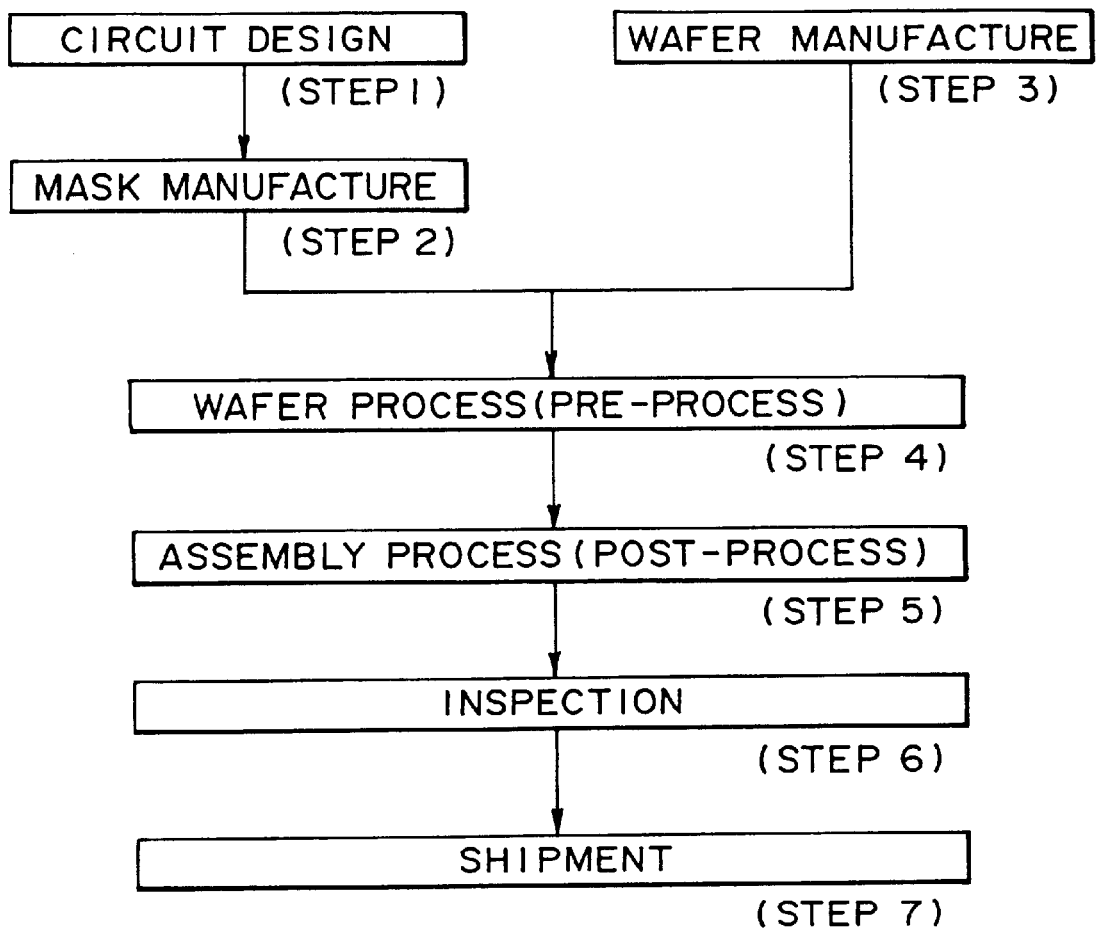
FIG. 10 is a flow chart of semiconductor device manufacturing processes.

FIG. 10 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 11:
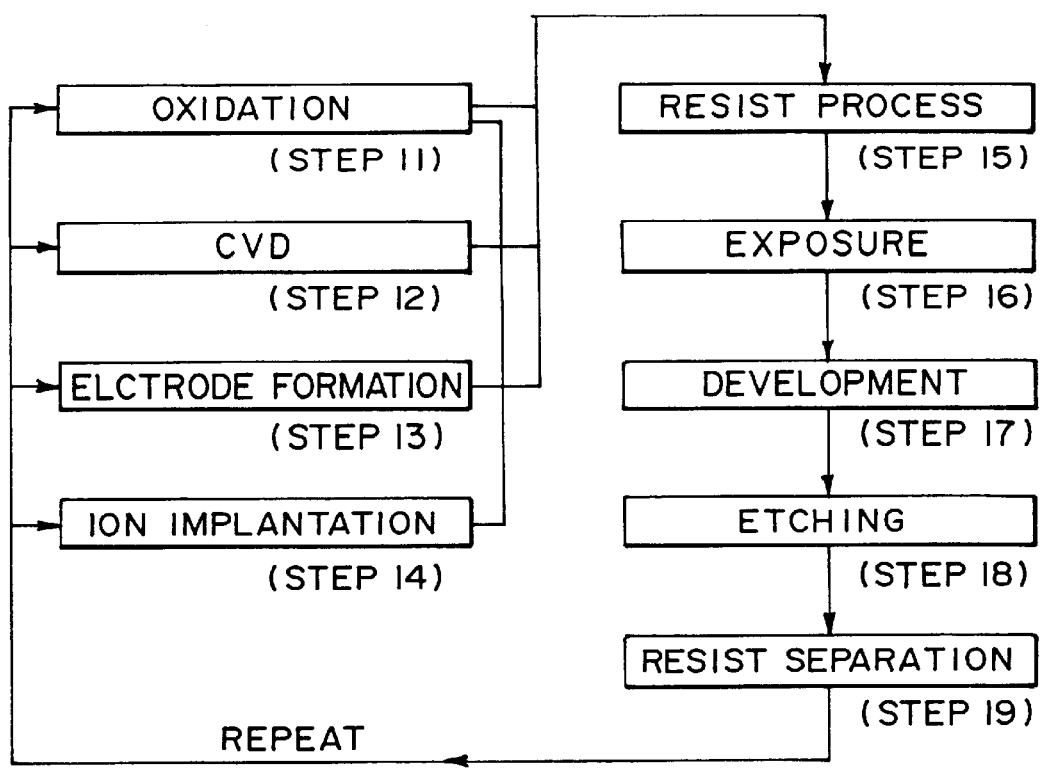
FIG. 11 is a flow chart of a wafer process.

FIG. 11 is a flow chart showing details of the water process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for illuminating a mask with light from a light source and for exposing a wafer with a pattern of the mask, said apparatus comprising:

a stage for holding the wafer movably with respect to the mask;

a base for supporting said stage;

a chamber for accommodating said stage and said base therein, said chamber being adapted to maintain a tight seal sufficient to provide a vacuum or reduced pressure therein;

a supporting member for supporting said base through an opening of said chamber; and a mount for supporting said supporting member and for reducing an adverse effect of vibration, said mount being separate from said chamber.

2. An exposure apparatus according to claim 1, further comprising shielding means for providing gas-tight shield of said opening of said chamber.

3. An exposure apparatus according to claim 2, wherein said shielding means includes an elastic bellows.

4. An apparatus according to claim 1, wherein said mount is disposed on a floor and is serviceable to reduce an adverse effect of vibration from the floor.

5. An apparatus according to claim 1, wherein said light source is an X-ray source.

6. An apparatus according to claim 1, wherein said chamber has a window through which the light from the light source is directed into said chamber.

7. An apparatus according to claim 1, wherein said mount is an air mount.

8. A device manufacturing method, comprising the steps of:

(a) illuminating a mask with light from a light source employing an exposure apparatus so as to expose a wafer with a pattern of the mask, the exposure apparatus including (i) a stage for holding the wafer movably with respect to the mask, (ii) a base for supporting the stage, (iii) a chamber for accommodating the stage and the base therein, the chamber being adapted to maintain a tight seal sufficient to provide a vacuum or a reduced pressure therein, (iv) a supporting member for supporting the base through an opening of the chamber, and (v) a mount for supporting the supporting member and for reducing an adverse effect of vibration, the mount being separate from the chamber; and (b) developing the exposed wafer.

* * * * *